United States Patent
Matsuzaki et al.

(12)

(10) Patent No.: US 9,088,245 B2
(45) Date of Patent: *Jul. 21, 2015

(54) DEMODULATION CIRCUIT AND RFID TAG INCLUDING THE DEMODULATION CIRCUIT

(71) Applicant: Semiconductor Energy Laboratory Co., Ltd., Atsugi-shi, Kanagawa-ken (JP)

(72) Inventors: Takanori Matsuzaki, Atsugi (JP); Yutaka Shionoiri, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 4 days.

This patent is subject to a terminal disclaimer.

(21) Appl. No.: 13/960,130

(22) Filed: Aug. 6, 2013

(65) Prior Publication Data

US 2013/0314152 A1    Nov. 28, 2013

Related U.S. Application Data

(63) Continuation of application No. 13/558,694, filed on Jul. 26, 2012, now Pat. No. 8,525,585, which is a continuation of application No. 13/026,508, filed on Feb. 14, 2011, now Pat. No. 8,258,862.

(30) Foreign Application Priority Data

Feb. 19, 2010    (JP) .................. 2010-034858

(51) Int. Cl.
*H03D 1/18*    (2006.01)
*H01L 27/12*    (2006.01)

(52) U.S. Cl.
CPC .............. *H03D 1/18* (2013.01); *H01L 27/1225* (2013.01)

(58) Field of Classification Search
CPC .................................. H03D 1/18; H03D 1/00
USPC .................. 329/347, 311, 312, 313, 314, 370
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1 607 900 A | 12/2005 |
| EP | 1 737 044 A | 12/2006 |

(Continued)

OTHER PUBLICATIONS

Cho et al., "Oxide TFT Rectifier with RF Antenna," IDW '09: Proceedings of the 16$^{th}$ International Display Workshops, Dec. 9, 2009, pp. 1815-1817.

(Continued)

*Primary Examiner* — Joseph Chang
*Assistant Examiner* — Jeffrey Shin
(74) *Attorney, Agent, or Firm* — Eric J. Robinson; Robinson Intellectual Property Law Office, P.C.

(57) ABSTRACT

An object is to provide a demodulation circuit having a sufficient demodulation ability. Another object is to provide an RFID tag which uses a demodulation circuit having a sufficient demodulation ability. A material which enables a reverse current to be small enough, for example, an oxide semiconductor material, which is a wide bandgap semiconductor, is used in part of a transistor included in a demodulation circuit. By using the semiconductor material which enables a reverse current of a transistor to be small enough, a sufficient demodulation ability can be secured even when an electromagnetic wave having a high amplitude is received.

17 Claims, 6 Drawing Sheets

(56) References Cited

U.S. PATENT DOCUMENTS

| | | |
|---|---|---|
| 6,031,419 A | 2/2000 | Roberts et al. |
| 6,126,077 A | 10/2000 | Tanaka et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,424,265 B2 | 9/2008 | Umeda et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,608,531 B2 | 10/2009 | Isa et al. |
| 7,674,650 B2 | 3/2010 | Akimoto et al. |
| 7,699,232 B2 | 4/2010 | Koyama et al. |
| 7,732,819 B2 | 6/2010 | Akimoto et al. |
| 7,807,515 B2 | 10/2010 | Kato et al. |
| 7,840,181 B2 | 11/2010 | Umeda et al. |
| 7,858,451 B2 | 12/2010 | Maekawa et al. |
| 7,890,054 B2 | 2/2011 | Umeda et al. |
| 7,907,006 B2 | 3/2011 | Iwata et al. |
| 8,258,862 B2 | 9/2012 | Matsuzaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0180637 A1 | 9/2004 | Nagai et al. |
| 2005/0017302 A1 | 1/2005 | Hoffman |
| 2005/0199959 A1 | 9/2005 | Chiang et al. |
| 2005/0282505 A1 | 12/2005 | Umeda et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119998 A1 | 6/2006 | Yang et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214008 A1 | 9/2006 | Asami et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0249398 A1 | 10/2007 | Watanabe et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0153450 A1 | 6/2008 | Atsumi et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114911 A1 | 5/2009 | Maekawa et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0224237 A1 | 9/2009 | Isa et al. |
| 2009/0278122 A1 | 11/2009 | Hosono et al. |
| 2009/0280600 A1 | 11/2009 | Hosono et al. |
| 2009/0284310 A1 | 11/2009 | Koyama et al. |
| 2009/0302935 A1 | 12/2009 | Iwata et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0149851 A1 | 6/2010 | Asami et al. |

FOREIGN PATENT DOCUMENTS

| | | |
|---|---|---|
| EP | 1 852 804 A | 11/2007 |
| EP | 2020686 A | 2/2009 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-162257 A | 6/1996 |
| JP | 08-264794 A | 10/1996 |
| JP | 10-013312 A | 1/1998 |
| JP | 11-505377 | 5/1999 |
| JP | 11-215026 A | 8/1999 |
| JP | 2000-044236 A | 2/2000 |
| JP | 2000-150900 A | 5/2000 |
| JP | 2001-266102 A | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-034085 A | 2/2006 |
| JP | 2006-295319 A | 10/2006 |
| JP | 2007-042690 A | 2/2007 |
| JP | 2007-220818 A | 8/2007 |
| JP | 2008-004791 A | 1/2008 |
| JP | 2008-108985 A | 5/2008 |
| JP | 2008-182687 | 8/2008 |
| JP | 2009-302652 A | 12/2009 |
| JP | 2010-016126 A | 1/2010 |

(56) References Cited

FOREIGN PATENT DOCUMENTS

| | | |
|---|---|---|
| JP | 2010-021247 A | 1/2010 |
| WO | WO 2004/114391 | 12/2004 |
| WO | WO-2007/139009 | 12/2007 |

OTHER PUBLICATIONS

International Search Report (Application No. PCT/JP2011/051380) dated May 10, 2011.

Written Opinion (Application No. PCT/JP2011/051380) dated May 10, 2011.

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

(56) References Cited

OTHER PUBLICATIONS

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, Or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

US 9,088,245 B2

DEMODULATION CIRCUIT AND RFID TAG INCLUDING THE DEMODULATION CIRCUIT

TECHNICAL FIELD

The invention disclosed herein relates to a demodulation circuit and an RFID tag that utilizes the demodulation circuit.

BACKGROUND ART

Recently, semiconductor devices that are capable of transmitting and receiving data without contact have been actively developed. Such semiconductor devices are particularly called RFID (radio frequency identification) tags, ID tags, IC tags, IC chips, RF tags, wireless tags, electronic tags, wireless chips, transponders, and the like.

The data transfer between the RFID tag and a communication device is generally carried out in such a manner that a device on the transmission side (e.g., the communication device) transmits a modulated carrier wave, and the device on the reception side (e.g., the RFID tag) demodulates the modulated carrier wave.

As one of the methods for modulating a carrier wave, there is an amplitude modulation method (an amplitude shift keying (ASK) modulation method). An ASK modulation method is a method in which a difference in amplitude of a carrier wave is generated and this amplitude difference is used as a modulation signal in transmitting data.

In order to extract data from the modulated carrier wave, the RFID tag is provided with a demodulation circuit. As an example of the demodulation circuit, there is a device that uses a rectifying function of a transistor whose gate terminal and drain terminal (or source terminal) are connected to each other (e.g., see Patent Document 1).
Reference

Patent Document

[Patent Document 1] Japanese Published Patent Application No. 2008-182687

DISCLOSURE OF INVENTION

By the way, energy of electromagnetic waves is inversely proportional to the square of the distance between a point on which the electromagnetic waves are radiated and an observation point. That is, as the distance between a communication device and an RFID tag becomes longer, the energy of electromagnetic waves that the RFID tag receives becomes lower; on the contrary, as the distance between the communication device and the RFID tag becomes shorter, the energy of electromagnetic waves that the RFID tag receives becomes higher.

As described above, the energy of electromagnetic waves that the RFID tag receives becomes higher when the distance between the communication device and the RFID tag is shorter. Therefore, in the case where the distance between the communication device and the RFID tag is short, an advantage in terms of supplied electric power can be gained generally. However, for example in an RFID tag provided with the demodulation circuit disclosed in Patent Document 1 which utilizes a rectifying function of a transistor whose gate terminal and drain terminal (or source terminal) are connected to each other, a reverse current is generated in the transistor when electromagnetic waves with large amplitude are received, so that a sufficient rectifying function cannot be obtained. In other words, it is difficult to perform sufficient demodulation.

In consideration of the above-described problem, an object of an embodiment of the invention disclosed herein is to provide a demodulation circuit having a sufficient demodulation ability. Further, another object is to provide an RFID tag provided with a demodulation circuit having a sufficient demodulation ability.

In the invention disclosed herein, a material which enables a reverse current to be small enough, for example an oxide semiconductor material, which is a wide bandgap semiconductor, is used in a transistor in a demodulation circuit, whose gate terminal and drain terminal (or source terminal) are connected to each other. By using a semiconductor material which enables a reverse current of a transistor whose gate terminal and drain terminal (or source terminal) are connected to each other to be small enough, even in the case where electromagnetic waves with large amplitude are received, a sufficient demodulation ability can be secured.

Specifically, the following structures can be employed, for example.

An embodiment of the present invention is a demodulation circuit which includes a first transistor, a second transistor, a first capacitor, a second capacitor, a third capacitor, a first resistor, and a second resistor. In addition, a gate terminal of the first transistor, a drain terminal (or a source terminal) of the first transistor, a source terminal (or a drain terminal) of the second transistor, and one terminal of the first capacitor are electrically connected to each other; a gate terminal of the second transistor, a drain terminal (or a source terminal) of the second transistor, one terminal of the second capacitor, one terminal of the third capacitor, and one terminal of the first resistor are electrically connected to each other; a source terminal (or a drain terminal) of the first transistor, the other terminal of the second capacitor, the other terminal of the first resistor, and one terminal of the second resistor are electrically connected to each other; the other terminal of the third capacitor and the other terminal of the second resistor are electrically connected to each other; and a channel formation region of the first transistor and a channel formation region of the second transistor include an oxide semiconductor.

In the above-described demodulation circuit, a reference potential may be supplied to a node which is electrically connected to the gate terminal of the second transistor, the drain terminal (or the source terminal) of the second transistor, the one terminal of the second capacitor, the one terminal of the third capacitor, and the one terminal of the first resistor.

Another embodiment of the present invention is a demodulation circuit which includes a first transistor, a second transistor, a first capacitor, a second capacitor, a third capacitor, a first resistor, and a second resistor. In addition, a gate terminal of the second transistor, a drain terminal (or a source terminal) of the second transistor, a source terminal (or a drain terminal) of the first transistor, and one terminal of the first capacitor are electrically connected to each other; a source terminal (or a drain terminal) of the second transistor, one terminal of the second capacitor, one terminal of the third capacitor, and one terminal of the first resistor are electrically connected to each other; a gate terminal of the first transistor, a drain terminal (or a source terminal) of the first transistor, the other terminal of the second capacitor, the other terminal of the first resistor, and one terminal of the second resistor are electrically connected to each other; the other terminal of the third capacitor and the other terminal of the second resistor are electrically connected to each other; and a channel formation region of the first transistor and a channel formation region of the second transistor include an oxide semiconductor.

In the above-described demodulation circuit, a reference potential may be supplied to a node which is electrically connected to the source terminal (or the drain terminal) of the second transistor, the one terminal of the second capacitor, the one terminal of the third capacitor, and the one terminal of the first resistor.

By using any of the embodiments of the demodulation circuit, an RFID tag having excellent characteristics can be obtained.

Note that although the transistor may be formed using an oxide semiconductor in the above embodiments, the invention disclosed herein is not limited thereto. A material which can realize reverse current characteristics equivalent to those of the oxide semiconductor, such as a wide bandgap material (more specifically, a semiconductor material with an energy gap Eg of larger than 3 eV) like silicon carbide, may be used.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are only used for convenience of description, and the positions of components may be reversed upside down, unless otherwise specified.

In addition, in this specification and the like, the term such as "electrode" or "wiring" does not limit the function of the component. For example, an "electrode" can be used as part of "wiring", and vice versa. Further, the term "electrode" or "wiring" can also mean a combination of a plurality of "electrodes" and "wirings" formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function." There is no particular limitation on the "object having any electric function" as long as electric signals can be transmitted and received between components that are connected through the object.

Examples of the "object having any electric function" are a switching element such as a transistor, a resistor, an inductor, a capacitor, and an element with a variety of functions as well as an electrode and a wiring.

By using an oxide semiconductor in a transistor whose gate terminal and drain terminal (or source terminal) are connected to each other, a reverse current can be made small enough. Therefore, using this transistor, an ability of a demodulation circuit can be improved sufficiently. Accordingly, even when the distance between a communication device and an RFID tag is short, favorable data transmission and reception can be carried out.

In this manner, by using a transistor including an oxide semiconductor (in a broad sense, a transistor in which a reverse current can be small enough) in part of a demodulation circuit, the demodulation circuit can have excellent characteristics. Further, with the use of the demodulation circuit, an RFID tag having excellent characteristics can be realized.

BEST MODE FOR CARRYING OUT THE INVENTION

Figure 1A:
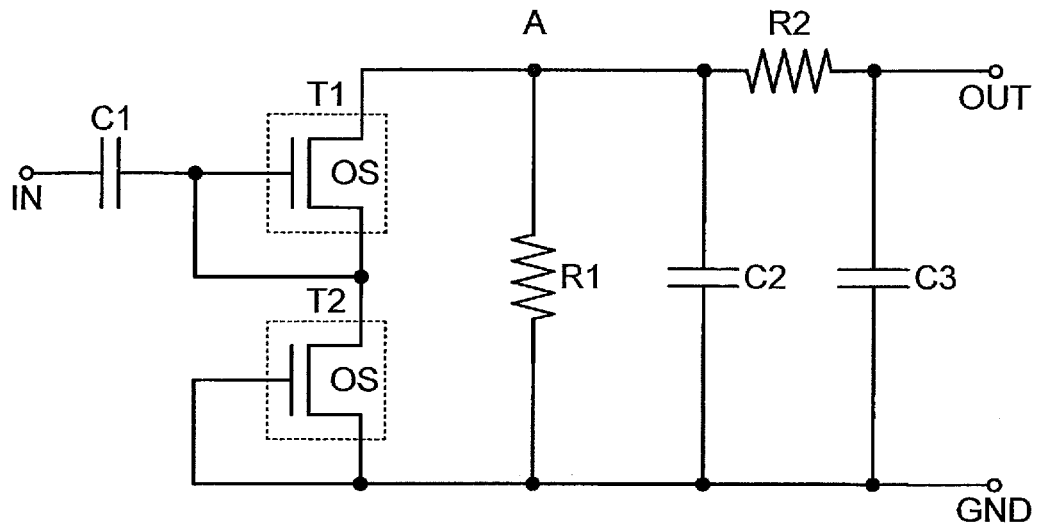
FIGS. 1A and 1B are circuit diagrams of semiconductor devices.

Hereinafter, embodiments of the present invention will be described with reference to the drawings. Note that the present invention is not limited to the following description and it will be easily understood by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the invention disclosed herein is not necessarily limited to such position, size, range, and the like disclosed in the drawings and the like.

In this specification and the like, ordinal numbers such as "first", "second", and "third" are used in order to avoid confusion among components, and the terms do not limit the components numerically.

(Embodiment 1)

In this embodiment, a circuit configuration and the like of a semiconductor device according to an embodiment of the invention disclosed herein will be described with reference to FIGS. 1A and 1B, FIGS. 2A to 2C, and FIGS. 3A to 3C. Note that in circuit diagrams, "OS" may be written beside a transistor in order to indicate that the transistor includes an oxide semiconductor.

<Circuit Configuration>

First, circuit configurations and functions of components of a semiconductor device of an embodiment of the invention disclosed herein will be described with reference to FIGS. 1A and 1B.

FIG. 1A shows an example of a demodulation circuit of the invention disclosed herein. The demodulation circuit includes a first transistor T1, a second transistor T2, a first capacitor C1, a second capacitor C2, a third capacitor C3, a first resistor R1, and a second resistor R2.

Here, a gate terminal of the first transistor T1, a drain terminal (or a source terminal) of the first transistor T1, a source terminal (or a drain terminal) of the second transistor T2, and one terminal of the first capacitor C1 are electrically connected to each other. In addition, a gate terminal of the second transistor T2, a drain terminal (or a source terminal) of the second transistor T2, one terminal of the second capacitor C2, one terminal of the third capacitor C3, and one terminal of the first resistor R1 are electrically connected to each other. Further, a source terminal (or a drain terminal) of the first transistor T1, the other terminal of the second capacitor C2, the other terminal of the first resistor R1, and one terminal of the second resistor R2 are electrically connected to each other. Furthermore, the other terminal of the third capacitor C3 and the other terminal of the second resistor R2 are electrically connected to each other. Note that the other terminal of the first capacitor C1 functions as an input terminal IN, and a node which is electrically connected to the other terminal of the third capacitor C3 and the other terminal of the second resistor R2 functions as an output terminal OUT.

In the demodulation circuit shown in FIG. 1A, normally, a reference potential $V_{GND}$ is supplied to a node GND which is electrically connected to the gate terminal of the second transistor T2, the drain terminal (or the source terminal) of the second transistor T2, the one terminal of the second capacitor C2, the one terminal of the third capacitor C3, and the one terminal of the first resistor R1.

In the demodulation circuit shown in FIG. 1A, a channel formation region of the first transistor T1 and a channel formation region of the second transistor T2 are formed using a material which enables a reverse current to be small enough, for example, an oxide semiconductor. Thus, even in a situation where a high reverse voltage is applied between the source terminal and the drain terminal of the transistor, a sufficient rectifying function can be obtained. That is, a demodulation circuit having a sufficient demodulation ability can be realized.

Figure 1B:
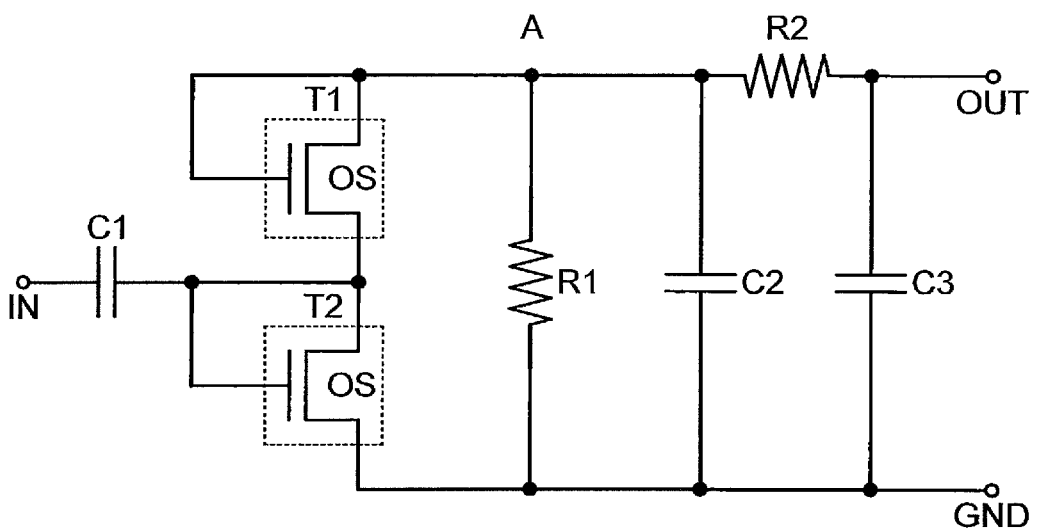

FIG. 1B shows another example of the demodulation circuit of the invention disclosed herein. Components of the demodulation circuit are similar to those of the demodulation circuit shown in FIG. 1A. That is, the demodulation circuit in FIG. 1B includes the first transistor T1, the second transistor T2, the first capacitor C1, the second capacitor C2, the third capacitor C3, the first resistor R1, and the second resistor R2.

Note that the demodulation circuit shown in FIG. 1B is different from that of FIG. 1A in the connection relation of components.

Specifically, the gate terminal of the second transistor T2, the drain terminal (or the source terminal) of the second transistor T2, the source terminal (or the drain terminal) of the first transistor T1, and the one terminal of the first capacitor C1 are electrically connected to each other. In addition, the source terminal (or the drain terminal) of the second transistor T2, the one terminal of the second capacitor C2, the one terminal of the third capacitor C3, and the one terminal of the first transistor R1 are electrically connected to each other. Further, the gate terminal of the first transistor T1, the drain terminal (or the source terminal) of the first transistor T1, the other terminal of the second capacitor C2, the other terminal of the first resistor R1, and the one terminal of the second resistor R2 are electrically connected to each other. Note that the other terminal of the first capacitor functions as an input terminal IN, and the node which is electrically connected to the other terminal of the third capacitor C3 and the other terminal of the second resistor R2 functions as an output terminal OUT.

In the demodulation circuit shown in FIG. 1B, normally, a reference potential $V_{GND}$ is supplied to the node GND which is electrically connected to the source terminal (or the drain terminal) of the second transistor T2, the one terminal of the second capacitor C2, the one terminal of the third capacitor C3, and the one terminal of the first resistor R1.

In the demodulation circuit shown in FIG. 1B, a channel formation region of the first transistor T1 and a channel formation region of the second transistor T2 are formed using a material which enables a reverse current to be small enough, for example, an oxide semiconductor. Thus, even in a situation where a high reverse voltage is applied between the source terminal and the drain terminal of the transistor, a sufficient rectifying function can be obtained. That is, a demodulation circuit having a sufficient demodulation ability can be realized.

In the demodulation circuits shown in FIGS. 1A and 1B, the first capacitor C1 has a function of compensating the center (reference line) of a wave amplitude. The second capacitor C2 has a function of smoothing a waveform. Further, the first resistor R1 has a function of keeping a current flowing through a point A constant.

The resistance value of the first resistor R1 is determined on the basis of the capacitance of the second capacitor C2. If the resistance value of the first resistor R1 is too small, the amplitude of a signal obtained via a carrier wave becomes small. In contrast, if the resistance value of the first resistor R1 is too large, a breakdown phenomenon of the second transistor T2 is caused and the second transistor T2 does not operate normally.

Further, the second resistor R2 and the third capacitor C3 function as a low-pass filter that removes a high-frequency component.

<Features of Demodulation Circuit>

Next, features of the demodulation circuits shown in FIGS. 1A and 1B will be described with reference to FIGS. 2A to 2C and FIGS. 3A to 3C.

Figure 2A:
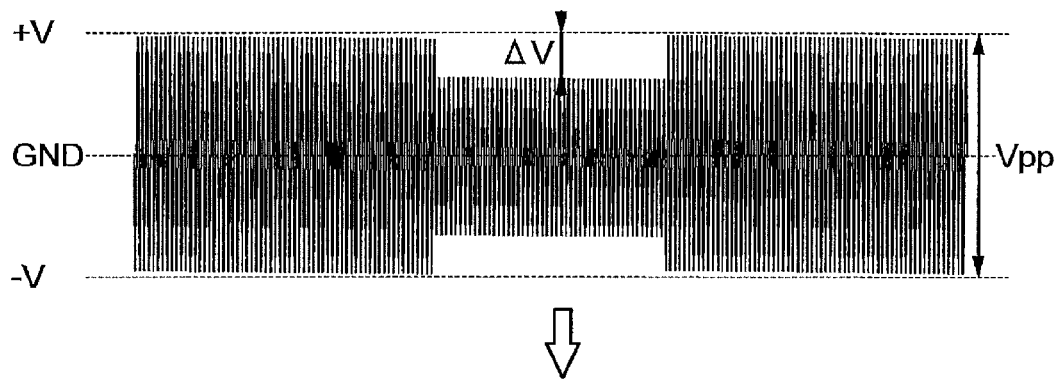
FIGS. 2A to 2C show operation of a semiconductor device.
Figure 2B:
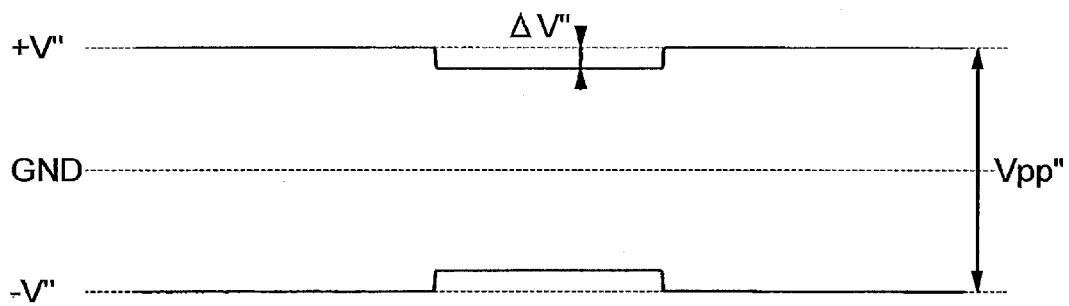

First, a demodulated signal obtained with a conventional demodulation circuit will be described with reference to FIGS. 2A to 2C. FIG. 2A shows a carrier wave that is input to a demodulation circuit. The potential difference Vpp between a maximum potential and a minimum potential of the carrier wave is 2V (that is, the amplitude is V), and the carrier wave is modulated by 2ΔV.

After demodulation of the carrier wave in "an ideal condition", a signal which can be expressed by an envelope in which a potential difference Vpp' between a maximum potential and a minimum potential is 2V' and a modulation amount is 2ΔV' is obtained. Here, "an ideal condition" means such a condition where a reverse current is not generated in a transistor having a rectifying function in a demodulation circuit, in other words, such a condition where a potential on the input side and a potential on the output side of a transistor have a linear relation and a sufficient rectifying function can be obtained.

Figure 2C:
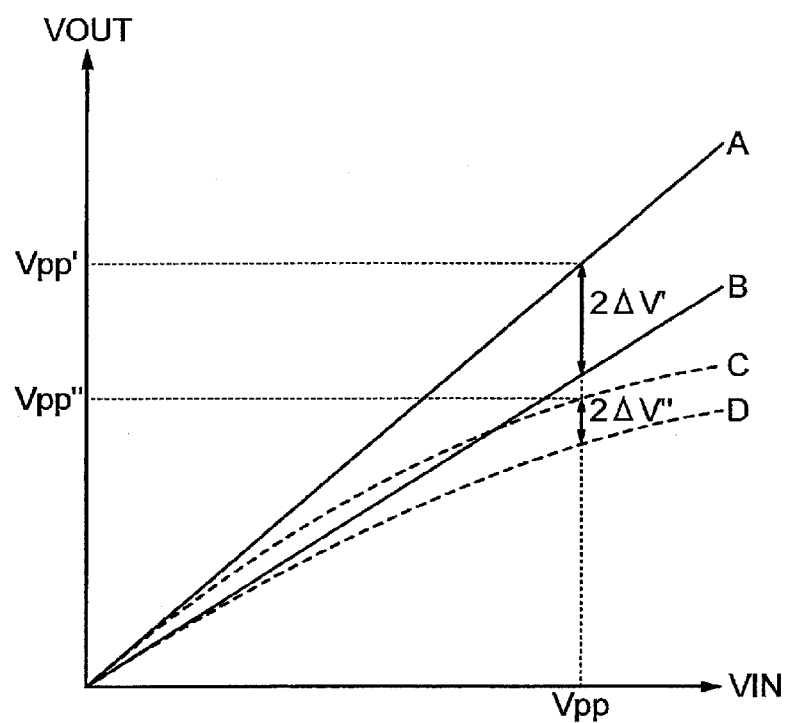

In the above-described "ideal condition", the relations between an input potential difference VIN (a potential difference between a maximum potential and a minimum potential of a carrier wave) of a demodulation circuit and an output potential difference VOUT of the demodulation circuit are expressed by a line A and a line B in FIG. 2C. Here, the line A shows a relation between the input potential difference VIN of a demodulation circuit and the output potential difference VOUT of the demodulation circuit in the case where modulation is not performed. The line B shows a relation between the input potential difference VIN of the demodulation circuit and the output potential difference VOUT of the demodulation circuit in the case where modulation is performed. That is, a difference between the VOUT when the VIN is Vpp in the line A and the VOUT when the VIN is Vpp in the line B corresponds to a potential difference (2ΔV') in a modulated portion of the output signal.

Various circuits are connected to the output terminal OUT side of the demodulation circuit, and various operations are carried out with the use of signals which are output in the above-described manner. Therefore, the output signal needs to have a sufficient and constant ratio of the potential difference in a modulated portion with respect to the potential difference Vpp' between the maximum potential and the minimum potential.

However, in a conventional demodulation circuit, when the input potential difference VIN is large, a large reverse current is generated in the transistor having a rectifying function, so that the rectifying function becomes weaker. As a result, the output from the demodulation circuit with respect to the input to the demodulation circuit is not linear, and a signal having a sufficient and constant strength ratio cannot be output. In other words, the output signal does not correspond to the envelope of the input (see FIGS. 2A and 2B).

The relations between the input potential difference VIN and the output potential difference VOUT of the conventional demodulation circuit are expressed by a line C and a line D in FIG. 2C. From FIG. 2C, it can be understood that as compared to the signal potential difference Vpp' and the potential difference 2ΔV' in a modulated portion in an ideal condition, a conventional demodulation circuit has a smaller signal potential difference of Vpp" and a smaller potential difference in a modulated portion of 2ΔV". In addition, since the input potential difference VIN and the output potential difference VOUT are not linear, in the output signal, the ratio of the potential difference in a modulated portion with respect to the potential difference between a maximum potential and a minimum potential varies depending on the input potential difference VIN.

On the other hand, in a demodulation circuit of an embodiment of the invention disclosed herein, a transistor having a rectifying function includes a material which enables a reverse current to be small enough, for example, an oxide semiconductor. Accordingly, the phenomenon of a rectifying function becoming weaker due to generation of a reverse current can be suppressed, and saturation of the output from the demodulation circuit can be prevented. In other words, the output from the demodulation circuit corresponding to the input to the demodulation circuit can be linear and a condition sufficiently close to the "ideal condition" can be made (see FIGS. 3A and 3B).

Figure 3A:
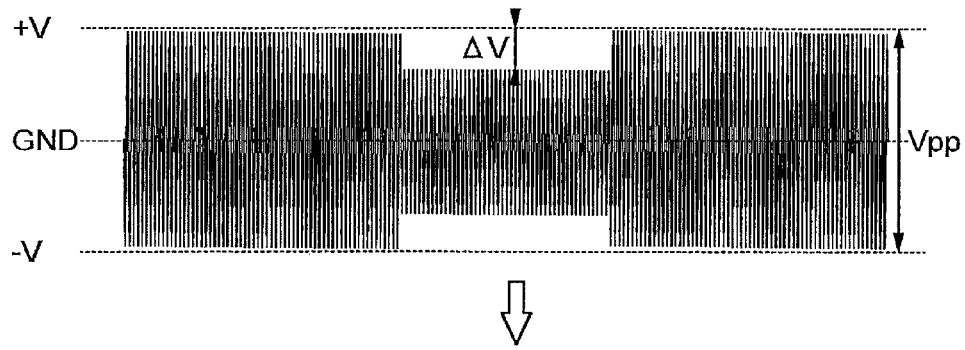
FIGS. 3A to 3C show operation of a semiconductor device.
Figure 3B:
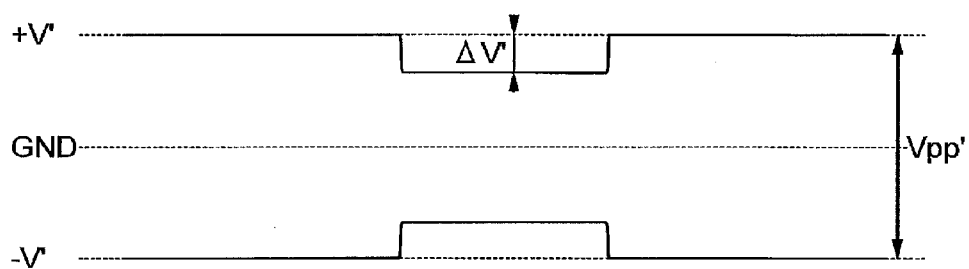
Figure 3C:
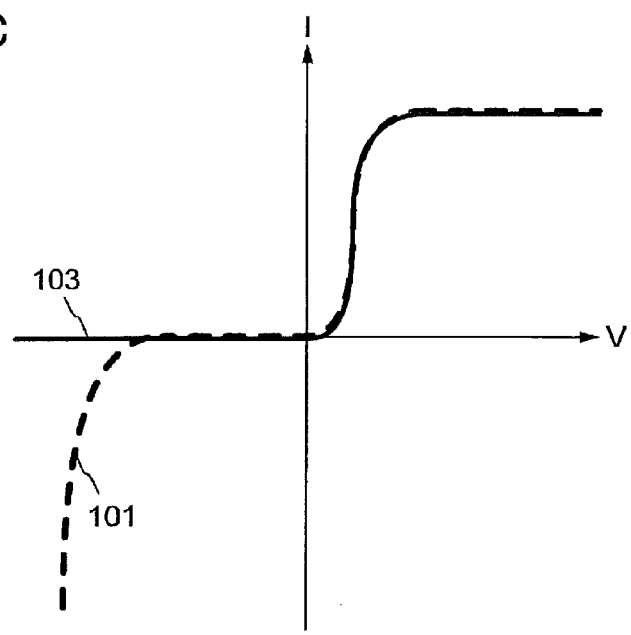

Rectifying characteristics of a transistor whose gate terminal and drain terminal (or source terminal) are connected to each other is shown in FIG. 3C. In the drawing, a broken line 101 shows rectifying characteristics of a conventional transistor (e.g., a transistor including silicon), and a solid line 103 shows rectifying characteristics of a transistor including a material which enables a reverse current to be small enough, (e.g., a transistor including an oxide semiconductor). From FIG. 3C, it is found that both the conventional transistor and the transistor including a material which enables a reverse current to be small enough have favorable characteristics when being applied with a forward voltage. When a reverse voltage is applied, the characteristics of the conventional transistor are degraded; in contrast, the characteristics of the transistor including a material which enables a reverse current to be small enough are favorable. Using a transistor in which a reverse current is not generated even when a high reverse voltage is applied, a demodulation circuit having a sufficient demodulation ability can be realized.

(Embodiment 2)

In this embodiment, an RFID tag which is an example to which the demodulation circuit described in the above embodiment is applied will be described with reference to FIG. 4.

The RFID tag of this embodiment includes a memory circuit storing necessary data and exchanges data with the outside using contactless means such as wireless communication. Having these features, the RFID tag can be used for an individual authentication system in which an object is identified by reading individual information of the object, or the like. Note that the RFID tag is required to have extremely high reliability in order to be used for this purpose.

A configuration of the RFID tag will be described with reference to FIG. 4. FIG. 4 is a block diagram showing a configuration of an RFID tag.

Figure 4:
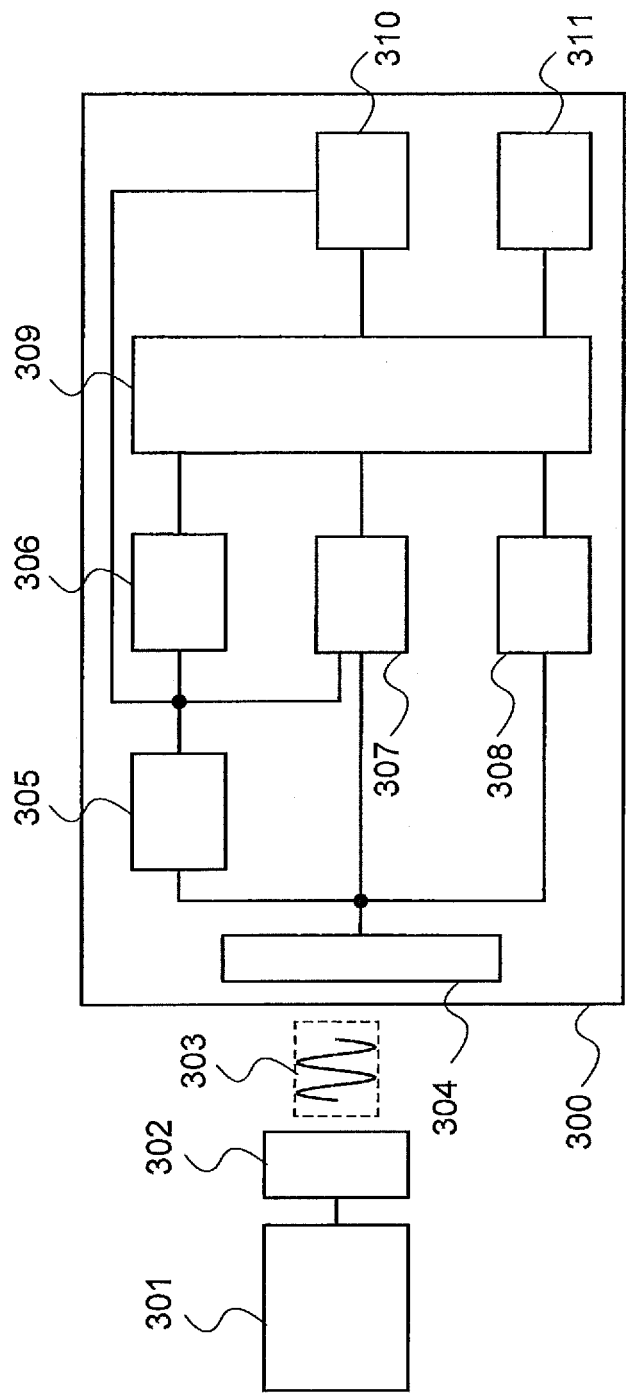
FIG. 4 illustrates an example of the structure of an RFID tag.

As shown in FIG. 4, an RFID tag 300 includes an antenna 304 which receives a radio signal 303 that is transmitted from an antenna 302 connected to a communication device 301 (also referred to as an interrogator, a reader/writer, or the like). The RFID tag 300 includes a rectifier circuit 305, a constant voltage circuit 306, a demodulation circuit 307, a modulation circuit 308, a logic circuit 309, a memory circuit 310, and a ROM 311. In a manner similar to that of the above embodiment, the demodulation circuit 307 includes a material which enables a reverse current to be small enough, for example, an oxide semiconductor, in part of a transistor. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 300 of this embodiment.

Next, the structure of each circuit will be described. The antenna 304 exchanges the radio signal 303 with the antenna 302 which is connected to the communication device 301. The rectifier circuit 305 generates an input potential by rectification, for example, half-wave voltage doubler rectification of an input alternating signal generated by reception of a radio signal at the antenna 304 and smoothing of the rectified signal with a capacitor provided in a later stage in the rectifier circuit 305. Note that a limiter circuit may be provided on an input side or an output side of the rectifier circuit 305. The limiter circuit controls electric power so that electric power which is higher than or equal to certain electric power is not input to a circuit in a later stage if the amplitude of the input alternating signal is high and an internal generation voltage is high.

The constant voltage circuit 306 generates a stable power supply voltage from an input potential and supplies it to each circuit. Note that the constant voltage circuit 306 may include a reset signal generation circuit. The reset signal generation circuit is a circuit which generates a reset signal of the logic circuit 309 by utilizing rise of the stable power supply voltage.

The demodulation circuit 307 demodulates the input alternating signal by envelope detection and generates the demodulated signal. The demodulation circuit described in the above embodiment can be applied to the demodulation circuit 307. Further, the modulation circuit 308 performs modulation in accordance with data to be output from the antenna 304.

The logic circuit 309 analyzes and processes the demodulated signal. The memory circuit 310 holds the input data and includes a row decoder, a column decoder, a memory region, and the like. Further, the ROM 311 stores an identification number (ID) or the like and outputs it in accordance with processing.

Note that any of the above-described circuits may be omitted as appropriate.

In this embodiment, the demodulation circuit described in the above embodiment is mounted on the RFID tag 300. Therefore, even in a situation where the distance between the RFID tag 300 and the communication device 301 is short and the intensity of an input signal is high, a sufficient demodulation ability can be achieved. As a result, errors at the time of transmitting or receiving data can be reduced. That is, the RFID tag 300 can have high reliability of data transmission and reception.

The structures, methods, and the like described in this embodiment can be combined as appropriate with any of the structures, methods, and the like described in the other embodiments.

(Embodiment 3)

In this embodiment, examples of a transistor which can be applied to the demodulation circuit described in the above embodiment will be described with reference to FIGS. 5A to 5D. There is no particular limitation on the structure of the transistor; for example, a staggered type or a planar type having a top-gate structure or a bottom-gate structure can be employed as appropriate. Further, the transistor may have any of a single gate structure including one channel formation region, a double gate structure including two channel formation regions, or a triple gate structure including three channel formation regions. Alternatively, the transistor may have a dual gate structure including two gate electrode layers positioned over and below a channel region with a gate insulating layer provided therebetween.

FIGS. 5A to 5D each illustrate an example of a cross-sectional structure of a transistor. Transistors illustrated in FIGS. 5A to 5D are transistors including an oxide semiconductor as a semiconductor. An advantage of using an oxide semiconductor is that high mobility and a low off-state current can be obtained with an easy and low-temperature process.

Figure 5A:
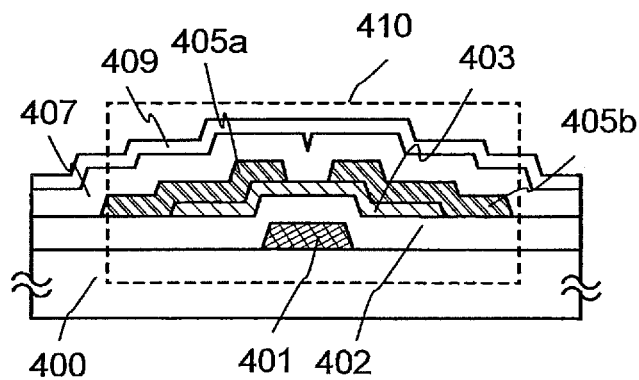
FIGS. 5A to 5D illustrate examples of the structure of a transistor.

A transistor 410 illustrated in FIG. 5A is an example of bottom-gate transistors, and is also referred to as an inverted staggered transistor.

The transistor 410 includes, over a substrate 400 having an insulating surface, a gate electrode layer 401, a gate insulating layer 402, an oxide semiconductor layer 403, a source electrode layer 405*a*, and a drain electrode layer 405*b*. Further, an insulating layer 407 being in contact with the oxide semiconductor layer 403 is provided so as to cover the transistor 410. Further, a protective insulating layer 409 is formed over the insulating layer 407.

Figure 5B:
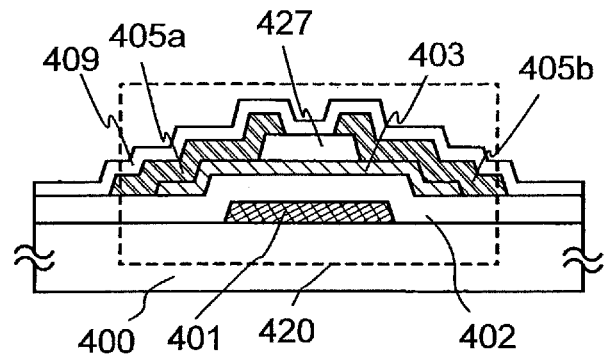

A transistor 420 illustrated in FIG. 5B is an example of bottom-gate transistors called channel-protective (channel-stop) transistors and is also called an inverted staggered transistor.

The transistor 420 includes, over the substrate 400 having an insulating surface, the gate electrode layer 401, the gate insulating layer 402, the oxide semiconductor layer 403, an insulating layer 427 which functions as a channel protective layer, the source electrode layer 405*a*, and the drain electrode layer 405*b*. Further, the protective insulating layer 409 is formed so as to cover the transistor 420.

Figure 5C:
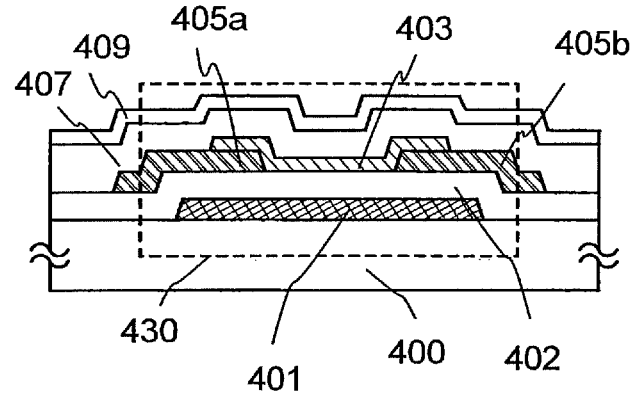

A transistor 430 illustrated in FIG. 5C is an example of bottom-gate transistors. The transistor 430 includes, over the substrate 400 having an insulating surface, the gate electrode layer 401, the gate insulating layer 402, the source electrode layer 405*a*, the drain electrode layer 405*b*, and the oxide semiconductor layer 403. Further, the insulating layer 407 being in contact with the oxide semiconductor layer 403 is provided so as to cover the transistor 430. The protective insulating layer 409 is further formed over the insulating layer 407.

In the transistor 430, the gate insulating layer 402 is provided over and in contact with the substrate 400 and the gate electrode layer 401; the source electrode layer 405*a* and the drain electrode layer 405*b* are provided over and in contact with the gate insulating layer 402. In addition, the oxide semiconductor layer 403 is provided over the gate insulating layer 402, the source electrode layer 405*a*, and the drain electrode layer 405*b*.

Figure 5D:
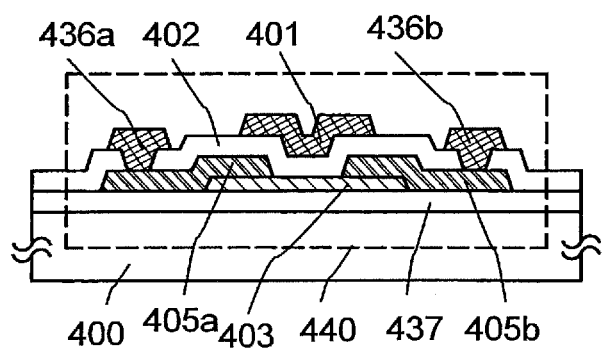

A transistor 440 illustrated in FIG. 5D is an example of top-gate transistors. The transistor 440 includes, over the substrate 400 having an insulating surface, an insulating layer 437, the oxide semiconductor layer 403, the source electrode layer 405*a*, the drain electrode layer 405*b*, the gate insulating layer 402, and the gate electrode layer 401. A wiring layer 436*a* and a wiring layer 436*b* are provided in contact with the source electrode layer 405*a* and the drain electrode layer 405*b*, respectively.

In this embodiment, as described above, the oxide semiconductor layer 403 is used as a semiconductor layer. As examples of an oxide semiconductor used for the oxide semiconductor layer 403, there are an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor which are two-component metal oxides; and an In—O-based oxide semiconductor, a Sn—O-based oxide semiconductor, and a Zn—O-based oxide semiconductor. Further, $SiO_2$ may be added to the above-described oxide semiconductor. Here, for example, an In—Ga—Zn—O-based oxide semiconductor is an oxide including at least In, Ga, and Zn, and there is no particular limitation on the composition ratio thereof. Further, the In—Ga—Zn—O-based oxide semiconductor may include an element other than In, Ga, and Zn.

For the oxide semiconductor layer 403, an oxide semiconductor represented by the chemical formula, $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

In the transistor 410, the transistor 420, the transistor 430, and the transistor 440 which include the oxide semiconductor layer 403, a reverse current can be made small enough. By using such transistor, a demodulation circuit having a sufficient demodulation ability can be realized.

There is no particular limitation on the substrate that can be used as the substrate 400 having an insulating surface. For example, a glass substrate, a quartz substrate, or the like which is used in a liquid crystal display device or the like can be used. Alternatively, a substrate in which an insulating layer is formed over a silicon wafer, or the like may be used.

In the bottom-gate transistors 410, 420, and 430, an insulating layer serving as a base may be provided between the substrate and the gate electrode layer. The insulating layer has a function of preventing diffusion of an impurity element from the substrate, and can be formed of one or more of a silicon nitride film, a silicon oxide film, a silicon nitride oxide film, and a silicon oxynitride film.

The gate electrode layer 401 can be formed using a metal material such as molybdenum, titanium, chromium, tantalum, tungsten, aluminum, copper, neodymium, or scandium, or an alloy material which includes any of these metal materials as a main component. The gate electrode layer 401 may have either a single-layer structure or a stacked structure.

The gate insulating layer 402 can be formed of one or more of a silicon oxide film, a silicon nitride film, a silicon oxynitride film, a silicon nitride oxide film, an aluminum oxide film, an aluminum nitride film, an aluminum oxynitride film, an aluminum nitride oxide film, and a hafnium oxide film by a plasma CVD method, a sputtering method, or the like. For example, a gate insulating layer (e.g., with a total thickness of 200 nm) can be formed in such a manner that a silicon nitride film ($SiN_y$ (y≥0)) with a thickness of 50 nm to 200 nm is formed as a first gate insulating layer by a plasma CVD method and a silicon oxide film ($SiO_x$ (x>0)) with a thickness of 5 nm to 300 nm is stacked over the first gate insulating layer by a sputtering method as a second gate insulating layer.

The source electrode layer 405a and the drain electrode layer 405b can be formed using a metal material such as molybdenum, titanium, chromium, tantalum, tungsten, aluminum, copper, neodymium, or scandium, or an alloy material which includes any of these metal materials as a main component. For example, the source electrode layer 405a and the drain electrode layer 405b can have a stacked structure of a layer of metal such as aluminum, copper, or the like and a layer of high-melting-point metal such as titanium, molybdenum, or tungsten. An aluminum material including an element which prevents generation of hillocks or whiskers (e.g., silicon, neodymium, or scandium) may be used for higher heat resistance.

Alternatively, the conductive film to be the source electrode layer 405a and the drain electrode layer 405b (including a wiring layer formed in the same layer as the source and drain electrode layers) may be a conductive metal oxide film. As a conductive metal oxide, indium oxide ($In_2O_3$), tin oxide ($SnO_2$), zinc oxide (ZnO), indium oxide-tin oxide alloy ($In_2O_3$—$SnO_2$, which is abbreviated as ITO in some cases), indium oxide-zinc oxide alloy ($In_2O_3$—ZnO), any of these metal oxide materials in which silicon oxide is contained, or the like can be used.

A material similar to that of the source electrode layer 405a and the drain electrode layer 405b can be used for the wiring layer 436a and the wiring layer 436b which are in contact with the source electrode layer 405a and the drain electrode layer 405b, respectively.

As the insulating layers 407, 427, and 437, an inorganic insulating film typified by a silicon oxide film, a silicon oxynitride film, an aluminum oxide film, and an aluminum oxynitride film, can be used.

As the protective insulating layer 409, an inorganic insulating film such as a silicon nitride film, an aluminum nitride film, a silicon nitride oxide film, or an aluminum nitride oxide film can be used.

In addition, a planarization insulating film may be formed over the protective insulating layer 409 in order to reduce surface unevenness due to the transistor. As the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed of these materials.

The structures, methods, and the like described in this embodiment can be combined as appropriate with any of the structures, methods, and the like described in the other embodiments.

(Embodiment 4)

In this embodiment, an example of a transistor including an oxide semiconductor layer and an example of a manufacturing method thereof will be described in detail with reference to FIGS. 6A to 6E.

FIGS. 6A to 6E are cross-sectional views illustrating a manufacturing process of a transistor. A transistor 510 illustrated here is an inverted staggered transistor similar to the transistor 410 illustrated in FIG. 5A.

An oxide semiconductor used for a semiconductor layer of this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen, which is an n-type impurity, is removed from an oxide semiconductor, and the oxide semiconductor is purified so as to contain as few impurities that are other than main components of the oxide semiconductor as possible.

Note that the purified oxide semiconductor includes extremely few carriers, and the carrier concentration is lower than $1\times10^{14}$ /cm$^3$, preferably lower than $1\times10^{12}$ /cm$^3$, further preferably lower than $1\times10^{11}$ /cm$^3$. Such few carriers enable a current in an off state (off-state current) to be small enough.

Specifically, in the transistor including the above-described oxide semiconductor layer, the off-state current density per channel width of 1 μm at room temperature (25° C.) can be 100 zA/μm ($1\times10^{-19}$ A/μm) or lower, or further 10 zA/μm ($1\times10^{-20}$ A/μm) or lower under conditions where the channel length L of the transistor is 10 μm and the source-drain voltage is 3 V.

The transistor 510 including the purified oxide semiconductor layer hardly has temperature dependence of an on-state current and also has an extremely small off-state current.

A process for manufacturing the transistor 510 over a substrate 505 will be described with reference to FIGS. 6A to 6E.

First, a conductive film is formed over the substrate 505 having an insulating surface, and then a gate electrode layer 511 is formed through a first photolithography process. Note that a resist mask used in the photolithography process may be formed by an inkjet method. Formation of the resist mask by an inkjet method needs no photomask; thus, manufacturing cost can be reduced.

As the substrate 505 having an insulating surface, a substrate similar to the substrate 400 described in the above embodiment can be used. In this embodiment, a glass substrate is used as the substrate 505.

An insulating layer serving as a base may be provided between the substrate 505 and the gate electrode layer 511. The insulating layer has a function of preventing diffusion of an impurity element from the substrate 505, and can be formed of one or more films selected from a silicon nitride film, a silicon oxide film, a silicon nitride oxide film, a silicon oxynitride film, and the like.

The gate electrode layer 511 can be formed using a metal material such as molybdenum, titanium, chromium, tantalum, tungsten, aluminum, copper, neodymium, or scandium, or an alloy material which includes any of these metal materials as a main component. The gate electrode layer 511 can have a single-layer structure or a stacked structure.

Next, a gate insulating layer 507 is formed over the gate electrode layer 511. The gate insulating layer 507 can be formed by a plasma CVD method, a sputtering method, or the like. The gate insulating layer 507 can be formed of one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like.

Further, in order that hydrogen, a hydroxyl group, and moisture are contained as little as possible in the gate insulating layer 507 and an oxide semiconductor film 530, it is preferable to preheat the substrate 505 over which the gate electrode layer 511 is formed or the substrate 505 over which the gate electrode layer 511 and the gate insulating layer 507 are formed, in a preheating chamber of a sputtering apparatus as pretreatment for the formation of the oxide semiconductor film 530, so that impurities such as hydrogen and moisture adsorbed on the substrate 505 are eliminated. As an evacuation unit, a cryopump is preferably provided in the preheating chamber. This preheating step may be performed on the substrate 505 over which layers up to and including a source electrode layer 515a and a drain electrode layer 515b are formed. Note that this preheating treatment can be omitted.

Figure 6A:
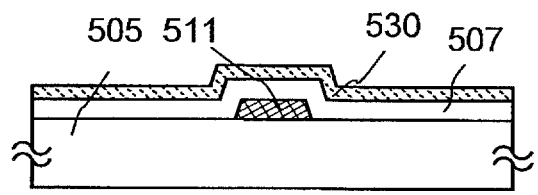
FIGS. 6A to 6E illustrate an example of a manufacturing method of a transistor.

Next, over the gate insulating layer 507, the oxide semiconductor film 530 with a thickness of greater than or equal to 2 nm and less than or equal to 200 nm, preferably greater than or equal to 5 nm and less than or equal to 30 nm is formed (see FIG. 6A).

For the oxide semiconductor film 530, any of the four-component metal oxide, the three-component metal oxides, the two-component metal oxides, an In—O-based oxide semiconductor, a Sn—O-based oxide semiconductor, a Zn—O-based oxide semiconductor, and the like, which are described in the above embodiment, can be used.

As a target for forming the oxide semiconductor film 530 by a sputtering method, it is particularly preferable to use a target having a composition ratio of In:Ga:Zn=1:x:y (x is 0 or more and y is more than or equal to 0.5 and less than or equal to 5). For example, a target having a composition ratio of In:Ga:Zn=1:1:1 [atomic ratio] (x=1, y=1) (that is, $In_2O_3$:$Ga_2O_3$:ZnO=1:1:2 [molar ratio]) can be used. Alternatively, a target having a composition ratio of In:Ga:Zn=1:1:0.5 [atomic ratio] (x=1, y=0.5), a target having a composition ratio of In:Ga:Zn=1:1:2 [atomic ratio] (x=1, y=2), or a target having a composition ratio of In:Ga:Zn=1:0:1 [atomic ratio] (x=0, y=1) can be used.

In this embodiment, an oxide semiconductor layer having an amorphous structure is formed by a sputtering method using an In—Ga—Zn—O-based metal oxide target.

The relative density of a metal oxide in the metal oxide target is greater than or equal to 80%, preferably greater than or equal to 95%, and further preferably greater than or equal to 99.9%. The use of a metal oxide target having high relative density makes it possible to form an oxide semiconductor layer with a dense structure.

The atmosphere in which the oxide semiconductor film 530 is formed is preferably a rare gas (typically, argon) atmosphere, an oxygen atmosphere, or a mixed atmosphere containing a rare gas (typically, argon) and oxygen. Specifically, it is preferable to use, for example, an atmosphere of a high-purity gas from which an impurity such as hydrogen, water, a hydroxyl group, or hydride is removed so that the concentration of the impurity is 1 ppm or lower (preferably the concentration is 10 ppb or lower).

In the formation of the oxide semiconductor film 530, for example, a process object may be held in a treatment chamber that is kept under reduced pressure and the process object may be heated so that the temperature of the process object is higher than or equal to 100° C. and lower than 550° C., preferably higher than or equal to 200° C. and lower than or equal to 400° C. Alternatively, the temperature of the process object in the formation of the oxide semiconductor film 530 may be room temperature (25° C.±10° C.). Then, a sputtering gas from which hydrogen, water, or the like is removed is introduced while moisture in the treatment chamber is removed, and the aforementioned target is used, whereby the oxide semiconductor film 530 is formed. In forming the oxide semiconductor film 530 while heating the process object, impurities in the oxide semiconductor layer can be reduced. Further, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. By evacuation with the cryopump or the like, hydrogen, water, and the like can be removed from the treatment chamber, whereby the impurity concentration in the oxide semiconductor film 530 can be reduced.

The oxide semiconductor film 530 can be formed under the following conditions, for example: the distance between the process object and the target is 170 mm, the pressure is 0.4 Pa, the direct-current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct-current (DC) power source is preferably used because dust (such as powder substances formed at the time of film formation) can be reduced and the film thickness can be uniform. The thickness of the oxide semiconductor film 530 is greater than or equal to 1 nm and less than or equal to 50 nm, preferably greater than or equal to 1 nm and less than or equal to 30 nm, and further preferably greater than or equal to 1 nm and less than or equal to 10 nm. With the oxide semiconductor film 530 having such a thickness, a short-channel effect due to miniaturization can be suppressed. Note that the appropriate thickness differs depending on the oxide semiconductor material to be used, the intended use of the semiconductor device, and the like; therefore, the thickness may be determined in accordance with the material, the intended use, and the like.

Note that before the oxide semiconductor film 530 is formed by a sputtering method, a substance attached to a surface where the oxide semiconductor film 530 is to be formed (e.g., a surface of the gate insulating layer 507) is preferably removed by reverse sputtering in which an argon gas is introduced to generate plasma. Here, the reverse sputtering is a method in which ions collide with a process surface so that the surface is modified, in contrast to normal sputtering in which ions collide with a sputtering target. As an example of a method for making ions collide with a process surface, there is a method in which high-frequency voltage is applied to the process surface in an argon atmosphere so that plasma is generated in the vicinity of the process object. Note that an atmosphere of nitrogen, helium, oxygen, or the like may be used instead of an argon atmosphere.

Next, the oxide semiconductor film 530 is processed into an island-shaped oxide semiconductor layer through a second photolithography process. Note that a resist mask used in the photolithography process may be formed by an inkjet method. Formation of the resist mask by an inkjet method needs no photomask; thus, manufacturing cost can be reduced.

In the case where a contact hole is formed in the gate insulating layer 507, a step of forming the contact hole can be performed at the same time as processing of the oxide semiconductor film 530.

As the etching of the oxide semiconductor film 530, either wet etching or dry etching or both of them may be employed. As an etchant used for wet etching of the oxide semiconductor film 530, a solution obtained by mixing phosphoric acid, acetic acid, and nitric acid, an ammonia peroxide mixture (31 wt % hydrogen peroxide water:28 wt % ammonia water: water=5:2:2), or the like can be used. An etchant such as ITO07N (produced by KANTO CHEMICAL CO., INC.) may also be used.

Figure 6B:
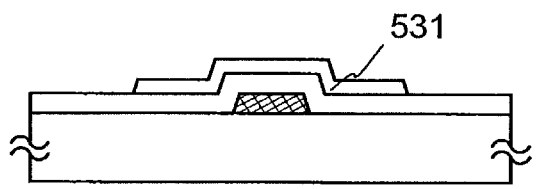

Then, heat treatment (first heat treatment) is performed on the oxide semiconductor layer, so that an oxide semiconductor layer 531 is formed (see FIG. 6B). By the first heat treatment, excessive hydrogen (including water and a hydroxyl group) in the oxide semiconductor layer is removed and a structure of the oxide semiconductor layer is improved, so that defect level in energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, a process object is introduced into an electric furnace in which a resistance heating element or the like is used and heated at 450° C. under a nitrogen atmosphere for an hour. During the heat treatment, the oxide semiconductor layer is not exposed to the air, in order to prevent entry of water and hydrogen.

The heat treatment apparatus is not limited to an electric furnace; the heat treatment apparatus can be an apparatus that heats a process object using thermal radiation or thermal conduction from a medium such as a heated gas or the like. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object using radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as argon is used.

For example, as the first heat treatment, GRTA treatment may be performed in the following manner. The process object is put in an inert gas atmosphere that has been heated, heated for several minutes, and then taken out of the inert gas atmosphere. The GRTA treatment enables high-temperature heat treatment in a short time. Moreover, in the GRTA treatment, even conditions of the temperature that exceeds the upper temperature limit of the process object can be employed. Note that the gas may be switched from the inert gas to a gas including oxygen during the process. This is because defect levels in the energy gap due to oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6 N (99.9999%) or more, preferably 7 N (99.99999%) or more (i.e., the impurity concentration is 1 ppm or less, preferably 0.1 ppm or less).

In any case, when impurities are reduced by the first heat treatment to form the oxide semiconductor layer that is an i-type (intrinsic) or substantially i-type semiconductor layer, a transistor with extremely excellent characteristics can be realized.

The above heat treatment (first heat treatment) has an effect of removing hydrogen, water, and the like and thus can be referred to as dehydration treatment, dehydrogenation treatment, or the like. The dehydration treatment or the dehydrogenation treatment can be performed after the formation of the oxide semiconductor film 530 and before the oxide semiconductor film 530 is processed into the island-shaped oxide semiconductor layer. Such dehydration treatment or dehydrogenation treatment may be conducted once or plural times.

The first heat treatment can be performed at any of the following timings other than the above timing: after formation of a source electrode layer and a drain electrode layer, after formation of an insulating layer over the source electrode layer and the drain electrode layer, and the like.

Next, a conductive film to be a source electrode layer and a drain electrode layer (including a wiring formed from the same film as the source electrode layer and the drain electrode layer) is formed over the gate insulating layer 507 and the oxide semiconductor layer 531. The conductive film used to form the source electrode layer and the drain electrode layer can be formed using any of the materials described in the above embodiment.

Figure 6C:
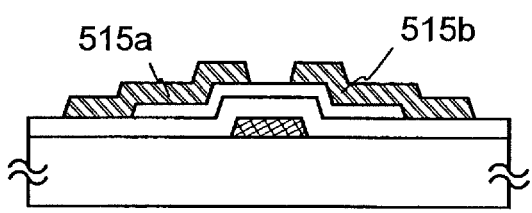

A resist mask is formed over the conductive film in a third photolithography process, and the source electrode layer 515a and the drain electrode layer 515b are formed by selective etching, and then, the resist mask is removed (see FIG. 6C).

Light exposure at the time of formation of the resist mask in the third photolithography process may be performed using ultraviolet light, KrF laser light, or ArF laser light. Note that the channel length (L) of the transistor is determined by the distance between the source electrode layer and the drain electrode layer. Therefore, in light exposure for forming a mask which is used for forming a transistor with a channel length (L) of less than 25 nm, it is preferable to use extreme ultraviolet light whose wavelength is as short as several nanometers to several tens of nanometers. In light exposure using extreme ultraviolet light, resolution is high and depth of focus is large. For these reasons, the channel length (L) of the transistor completed later can be greater than or equal to 10 nm and less than or equal to 1000 nm (1 μm), and the circuit can operate at high speed. Moreover, power consumption of the semiconductor device can be reduced by miniaturization.

In order to reduce the number of photomasks and the number of photolithography processes, the etching step may be performed using a resist mask formed with a multi-tone mask. Since a resist mask formed with a multi-tone mask includes regions of plural thicknesses and can be further changed in shape by performing etching, the resist mask can be used in a plurality of etching steps to provide different patterns. Therefore, a resist mask corresponding to at least two kinds of different patterns can be formed with one multi-tone mask. Thus, the number of light-exposure masks can be reduced and the number of corresponding photolithography processes can also be reduced, whereby simplification of the process can be realized.

Note that it is preferable that etching conditions be optimized so as not to etch and divide the oxide semiconductor layer 531 when the conductive film is etched. However, it is difficult to obtain etching conditions in which only the conductive film is etched and the oxide semiconductor layer 531 is not etched at all. In some cases, part of the oxide semiconductor layer 531 is etched when the conductive film is etched, whereby the oxide semiconductor layer 531 having a groove portion (a recessed portion) is formed.

Either wet etching or dry etching may be used for the etching of the conductive film. Note that dry etching is preferably used in terms of microfabrication of the element. An etching gas and an etchant can be selected as appropriate in accordance with a material of a layer to be etched. In this embodiment, a titanium film is used as the conductive film and an In—Ga—Zn—O based material is used for the oxide semiconductor layer 531; accordingly, in the case of employing wet etching, an ammonia hydrogen peroxide solution (a mixture of ammonia, water, and a hydrogen peroxide solution) is used as an etchant.

Next, plasma treatment using a gas such as $N_2O$, $N_2$, or Ar is preferably performed, so that water, hydrogen, or the like attached to a surface of an exposed portion of the oxide semiconductor layer may be removed. In the case of performing the plasma treatment, an insulating layer 516 serving as a protective insulating film is formed without being exposed to the air.

The insulating layer 516 is preferably formed to a thickness of at least 1 nm by a method by which an impurity such as water or hydrogen is not introduced into the insulating layer 516, such as a sputtering method. When hydrogen is contained in the insulating layer 516, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. As the insulating layer 516, a silicon oxide film, a silicon oxynitride film, an aluminum oxide film, an aluminum oxynitride film, or the like is preferably used.

In this embodiment, a silicon oxide film is formed to a thickness of 200 nm by a sputtering method as the insulating layer 516. The substrate temperature in deposition may be higher than or equal to room temperature (25° C.) and lower than or equal to 300° C., and is 100° C. in this embodiment. The silicon oxide film can be deposited by a sputtering method in a rare gas (typically, argon) atmosphere, an oxygen atmosphere, or a mixed atmosphere containing a rare gas and oxygen. As a target, a silicon oxide target or a silicon target may be used.

In order to remove residual moisture in the deposition chamber for the insulating layer 516 in a manner similar to that of the deposition of the oxide semiconductor film 530, an entrapment vacuum pump (such as a cryopump) is preferably used. When the insulating layer 516 is deposited in the deposition chamber which is evacuated using a cryopump, the impurity concentration in the insulating layer 516 can be reduced. A turbo pump provided with a cold trap may be used as an evacuation unit for removing moisture remaining in the deposition chamber used for forming the insulating layer 516.

A sputtering gas used for depositing the insulating layer 516 is preferably a high-purity gas from which an impurity such as hydrogen or water is removed.

Next, second heat treatment is performed in an inert gas atmosphere or an oxygen gas atmosphere. The second heat treatment is performed at a temperature higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. By supply of oxygen from the insulating layer 516 to the oxide semiconductor layer 531, an oxygen deficiency in the oxide semiconductor layer 531 is compensated, whereby an i-type (intrinsic) or substantially i-type oxide semiconductor layer can be formed.

In this embodiment, the second heat treatment is performed after the formation of the insulating layer 516; however, the timing of the second heat treatment is not limited thereto. For example, the first heat treatment may be followed by the second heat treatment, or the first heat treatment may also serve as the second heat treatment.

In the above-described manner, through the first heat treatment and the second heat treatment, the oxide semiconductor layer 531 is purified so as not to contain an impurity other than main components of the oxide semiconductor layer, whereby the oxide semiconductor layer 531 can become an i-type (intrinsic) oxide semiconductor layer.

Figure 6D:
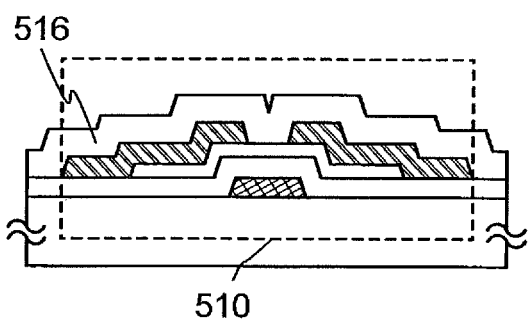

Through the above-described process, the transistor 510 is formed (see FIG. 6D).

Figure 6E:
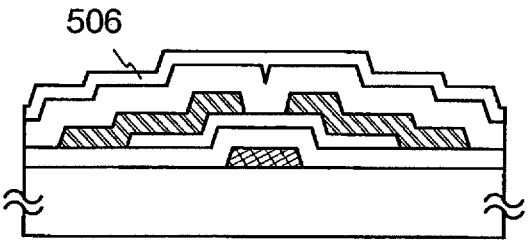

It is preferable to further form a protective insulating layer 506 over the insulating layer 516 (see FIG. 6E). The protective insulating layer 506 prevents entry of hydrogen, water, and the like from the outside. As the protective insulating layer 506, a silicon nitride film, an aluminum nitride film, or the like can be used, for example. The formation method of the protective insulating layer 506 is not particularly limited; however, an RF sputtering method is suitable because of its high productivity.

After the formation of the protective insulating layer 506, heat treatment may be further performed at a temperature of 100° C. to 200° C. inclusive for 1 hour to 30 hours inclusive in the air.

With the use of the transistor which includes a purified oxide semiconductor layer and is manufactured in accordance with this embodiment, a reverse current can be made small enough. Therefore, in the case of using this transistor in a demodulation circuit, the demodulation circuit can have a sufficient demodulation ability.

The structures, methods, and the like described in this embodiment can be combined as appropriate with any of the structures, methods, and the like described in the other embodiments.

This application is based on Japanese Patent Application serial no. 2010-034858 filed with Japan Patent Office on Feb. 19, 2010, the entire contents of which are hereby incorporated by reference.

EXPLANATION OF REFERENCE

T1: first transistor, T2: second transistor, C1: first capacitor, C2: second capacitor, C3: third capacitor, R1: first resistor, R2: second resistor, 101: broken line, 103: solid line, 300: RFID tag, 301: communication device, 302: antenna, 303: radio signal, 304: antenna, 305: rectifier circuit, 306: constant voltage circuit, 307: demodulation circuit, 308: modulation circuit, 309: logic circuit, 310: memory circuit, 311: ROM, 400: substrate, 401: gate electrode layer, 402: gate insulating layer, 403: oxide semiconductor layer, 405a: source electrode layer, 405b: drain electrode layer, 407: insulating layer, 409: protective insulating layer, 410: transistor, 420: transistor, 427: insulating layer, 430: transistor, 436a: wiring layer, 436b: wiring layer, 437: insulating layer, 440: transistor, 505: substrate, 506: protective insulating layer, 507: gate insulating layer, 510: transistor, 511: gate electrode layer, 515a: source electrode layer, 515b: drain electrode layer, 516: insulating layer, 530: oxide semiconductor film, and 531: oxide semiconductor layer.

The invention claimed is:

1. A semiconductor device comprising:
an antenna;
a first transistor comprising a channel formation region including an oxide semiconductor;
a second transistor comprising a channel formation region including an oxide semiconductor; and
a first capacitor,
wherein the antenna is electrically connected to one terminal of the first capacitor,
wherein the other terminal of the first capacitor, a gate of the first transistor, one of a source and drain of the first transistor, and one of a source and a drain of the second transistor are electrically connected to one another, and
wherein a gate of the second transistor is electrically connected to the other of the source and the drain of the second transistor.

2. The semiconductor device according to claim 1, further comprising:
a second capacitor,
wherein one terminal of the second capacitor is electrically connected to the other of the source and the drain of the first transistor, and
wherein the other terminal of the second capacitor is electrically connected to the other of the source and the drain of the second transistor.

3. The semiconductor device according to claim 2, further comprising:
a resistor,
wherein one terminal of the resistor is electrically connected to the other of the source and the drain of the first transistor, and
wherein the other terminal of the resistor is electrically connected to the other of the source and the drain of the second transistor.

4. The semiconductor device according to claim 1, wherein the oxide semiconductor is selected from the group consisting of In—Sn—Ga—Zn—O based oxide semiconductor, In—Ga—Zn—O based oxide semiconductor, In—Sn—Zn—O based oxide semiconductor, In—Al—Zn—O based oxide semiconductor, Sn—Ga—Zn—O based oxide semiconductor, Al—Ga—Zn—O based oxide semiconductor, Sn—Al—Zn—O based oxide semiconductor, In—Zn—O based oxide semiconductor, Sn—Zn—O based oxide semiconductor, Al—Zn—O based oxide semiconductor, Zn—Mg—O based oxide semiconductor, Sn—Mg—O based oxide semiconductor, In—Mg—O based oxide semiconductor, In—O based oxide semiconductor, Sn—O based oxide semiconductor, and Zn—O based oxide semiconductor.

5. The semiconductor device according to claim 2, wherein the antenna receives a signal from a reader/writer.

6. The semiconductor device according to claim 2, wherein the semiconductor device is an RFID.

7. A semiconductor device comprising:
an antenna;
a first transistor comprising a channel formation region including a semiconductor material with an energy gap of larger than 3 eV;
a second transistor comprising a channel formation region including a semiconductor material with an energy gap of larger than 3 eV; and
a first capacitor,
wherein the antenna is electrically connected to one terminal of the first capacitor,
wherein the other terminal of the first capacitor, a gate of the first transistor, one of a source and drain of the first transistor, and one of a source and a drain of the second transistor are electrically connected to one another, and
wherein a gate of the second transistor is electrically connected to the other of the source and the drain of the second transistor.

8. The semiconductor device according to claim 7, further comprising:
a second capacitor,
wherein one terminal of the second capacitor is electrically connected to the other of the source and the drain of the first transistor, and
wherein the other terminal of the second capacitor is electrically connected to the other of the source and the drain of the second transistor.

9. The semiconductor device according to claim 7, further comprising:
a resistor,
wherein one terminal of the resistor is electrically connected to the other of the source and the drain of the first transistor, and
wherein the other terminal of the resistor is electrically connected to the other of the source and the drain of the second transistor.

10. The semiconductor device according to claim 8, wherein the semiconductor material is selected from the group consisting of In—Sn—Ga—Zn—O based oxide semiconductor, In—Ga—Zn—O based oxide semiconductor, In—Sn—Zn—O based oxide semiconductor, In—Al—Zn—O based oxide semiconductor, Sn—Ga—Zn—O based oxide semiconductor, Al—Ga—Zn—O based oxide semiconductor, Sn—Al—Zn—O based oxide semiconductor, In—Zn—O based oxide semiconductor, Sn—Zn—O based oxide semiconductor, Al—Zn—O based oxide semiconductor, Zn—Mg—O based oxide semiconductor, Sn—Mg—O based oxide semiconductor, In—Mg—O based oxide semiconductor, In—O based oxide semiconductor, Sn—O based oxide semiconductor, and Zn—O based oxide semiconductor.

11. The semiconductor device according to claim 7, wherein the antenna receives a signal from a reader/writer.

12. The semiconductor device according to claim 7, wherein the semiconductor device is an RFID.

13. A semiconductor device comprising:
an antenna;
a first transistor comprising a channel formation region including silicon and carbon;
a second transistor comprising a channel formation region including silicon and carbon; and
a first capacitor,
wherein the antenna is electrically connected to one terminal of the first capacitor,
wherein the other terminal of the first capacitor, a gate of the first transistor, one of a source and drain of the first transistor, and one of a source and a drain of the second transistor are electrically connected to one another, and
wherein a gate of the second transistor is electrically connected to the other of the source and the drain of the second transistor.

14. The semiconductor device according to claim 13, further comprising:
a second capacitor,
wherein one terminal of the second capacitor is electrically connected to the other of the source and the drain of the first transistor, and
wherein the other terminal of the second capacitor is electrically connected to the other of the source and the drain of the second transistor.

15. The semiconductor device according to claim 13, further comprising:
a resistor,
wherein one terminal of the resistor is electrically connected to the other of the source and the drain of the first transistor, and
wherein the other terminal of the resistor is electrically connected to the other of the source and the drain of the second transistor.

16. The semiconductor device according to claim 13, wherein the antenna receives a signal from a reader/writer.

17. The semiconductor device according to claim 13, wherein the semiconductor device is an RFID.

* * * * *

UNITED STATES PATENT AND TRADEMARK OFFICE
CERTIFICATE OF CORRECTION

PATENT NO. : 9,088,245 B2  
APPLICATION NO. : 13/960130  
DATED : July 21, 2015  
INVENTOR(S) : Takanori Matsuzaki et al.

Page 1 of 1

It is certified that error appears in the above-identified patent and that said Letters Patent is hereby corrected as shown below:

In the claims

In claim 3, column 19, line 10 "claim 2," should be --claim 1,--;

In claim 5, column 19, line 34 "claim 2," should be --claim 1,--;

In claim 6, column 19, line 36 "claim 2," should be --claim 1,--; and

In claim 10, column 20, line 8 "claim 8," should be --claim 7,--.

Signed and Sealed this  
Twelfth Day of January, 2016

Michelle K. Lee  
*Director of the United States Patent and Trademark Office*